(12) United States Patent
Brekelmans et al.

(10) Patent No.: US 8,279,005 B2
(45) Date of Patent: Oct. 2, 2012

(54) AMPLIFIER CIRCUIT

(75) Inventors: Johannes H. A. Brekelmans, Nederweert (NL); Lorenzo Tripodi, Eindhoven (NL)

(73) Assignee: NXP B.V., Eindhoven (NL)

( * ) Notice: Subject to any disclaimer, the term of this patent is extended or adjusted under 35 U.S.C. 154(b) by 128 days.

(21) Appl. No.: 12/593,829

(22) PCT Filed: Mar. 18, 2008

(86) PCT No.: PCT/IB2008/051020
§ 371 (c)(1),
(2), (4) Date: Sep. 29, 2009

(87) PCT Pub. No.: WO2008/120123
PCT Pub. Date: Oct. 9, 2008

(65) Prior Publication Data
US 2010/0026391 A1 Feb. 4, 2010

(30) Foreign Application Priority Data
Mar. 29, 2007 (EP) .................................... 07105263

(51) Int. Cl.
*H03F 3/18* (2006.01)
(52) U.S. Cl. ........................................ 330/264; 330/269
(58) Field of Classification Search .................. 330/262, 330/264, 269, 273; 327/534
See application file for complete search history.

(56) References Cited

U.S. PATENT DOCUMENTS

| | | | |
|---|---|---|---|
| 3,609,414 A | 9/1971 | Pleshko et al. | |
| 4,670,670 A | 6/1987 | Shoji | |
| 4,912,425 A | 3/1990 | Kobayashi et al. | |
| 6,064,262 A | 5/2000 | Wang | |
| 6,362,687 B2 | 3/2002 | Cox | |
| 6,366,141 B1 * | 4/2002 | Chiba et al. | 327/108 |
| 7,498,865 B2 * | 3/2009 | Sakiyama et al. | 327/534 |
| 7,525,381 B2 * | 4/2009 | Murden et al. | 330/261 |
| 2002/0180513 A1 | 12/2002 | Toyoyama et al. | |
| 2005/0275462 A1 | 12/2005 | Heightley et al. | |

(Continued)

FOREIGN PATENT DOCUMENTS
DE 3925342 A1 2/1991
(Continued)

OTHER PUBLICATIONS

Lehmann, Torsten, et al; "1-V Powr Supply COMOS Cascode Amplifier"; IEEE Journal of Solid-State Circuits; IEEE Service Center, Piscataway, NJ, US; vol. 36, No. 7; Jul. 1, 2001; XP011061546; ISSN: 0018-9200.

(Continued)

*Primary Examiner* — Khanh Nguyen (57) ABSTRACT

There is provided a method and apparatus for maintaining a bias current that flows through two transistors at a target level. The two transistors are both connected to form a series network between positive and negative voltage supply terminals. The bias current flows through the two transistors when the circuit is at equilibrium, and the threshold voltage of the transistors is controlled by controlling the voltage that is applied to the transistors bulk terminals. In addition to the two transistors, there is provided a control circuit that measures a circuit parameter that is indicative of the level of bias current flowing through the two transistors. In response to the measured parameter, the control circuit adjusts the bulk voltage levels of the two transistors so as to alter the transistors threshold voltages and maintain the level of bias current at a target level.

19 Claims, 4 Drawing Sheets

U.S. PATENT DOCUMENTS

2006/0066407 A1    3/2006    Narendra et al.

FOREIGN PATENT DOCUMENTS

| | | |
|---|---|---|
| JP | 11-284443 A | 10/1999 |
| WO | 2005/081400 A | 9/2005 |

OTHER PUBLICATIONS

Kim, C. H., et al; "Effectiveness of Using Supply Voltage as Back-Gate Bias in Ground Plane SOI MOSFET'S"; SOI Conference 2004; IEE International Charleston, SC, USA; Oct. 4-7, 2004; IEEE, Piscataway, NJ, USA; pp. 69-70; XP010766848; ISBN: 978-0-7803-8497-2.

* cited by examiner

AMPLIFIER CIRCUIT

This invention relates to an improved amplifier, and in particular to a CMOS push-pull amplifier.

Figure 1:
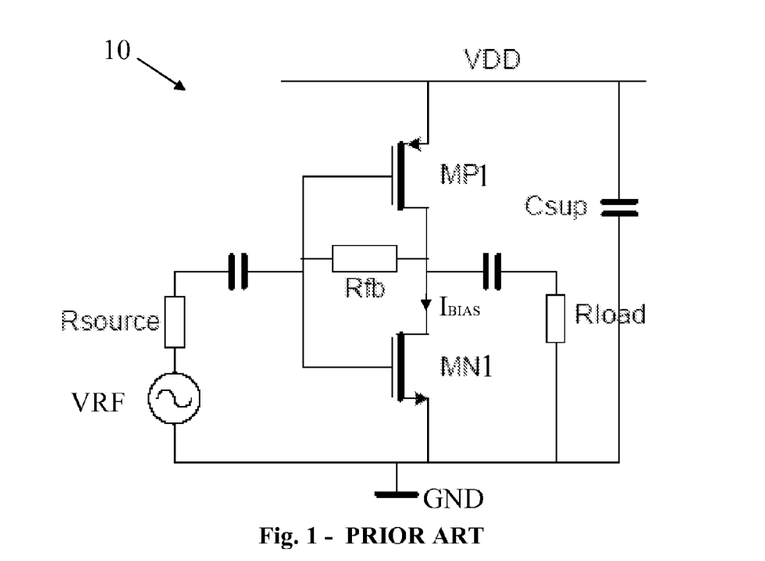
FIG. 1 shows a circuit diagram of a CMOS amplifier circuit as known in the prior art and as discussed above.

A known CMOS push-pull amplifier will now be described with reference to FIG. 1. The known CMOS push-pull amplifier 10 comprises a PMOS transistor MP1 and an NMOS transistor MN1 that are connected between the voltage supply terminals $V_{DD}$ and GND. The input signal to the amplifier 10 is provided by the voltage source VRF and the source resistance Rsource, and the output signal from the amplifier 10 is fed into the load resistance Rload. A resistor Rfb provides biasing, input matching and control over the gain. The capacitor Csup realizes a low impedance between the voltage supply terminals $V_{DD}$ and GND at high-frequencies, attenuating any RF signals that may be present between $V_{DD}$ and GND.

The drain current of a MOS transistor approximately depends on the geometrical properties of the transistor as shown in equation (1):

$$I_D = k\frac{W}{L}(V_{GS} - V_{TH})^2 \quad (1)$$

Wherein $I_D$ is the drain current, k is a constant that depends on the technology used, W is the width of the transistor and L is the length of the transistor, $V_{GS}$ is the voltage applied between the gate and the source terminals of the transistor, and $V_{TH}$ is the threshold voltage of the transistor.

The transistors MP1 and MN1 both have a voltage threshold ($V_{TH}$) of around 300 mV. If a MOS transistor pair is realized with matched transistors, then the output (and input) DC voltage is typically half of the supply voltage. When no input signal VRF is supplied, the circuit is in equilibrium, with both transistors MP1 and MN1 being turned on and with $V_{GS}=V_{DD}/2$. At equilibrium, a bias current $I_{BIAS}$ flows through the transistors MP1 and MN1 depending on the threshold values $V_{TH}$ of the PMOS and NMOS transistor respectively.

Such CMOS push-pull analogue amplifiers can find applications as low-noise, wideband amplifiers for amplifying Radio Frequency (RF) signals.

One of the problems with circuits comprising two transistors connected in series between positive and negative voltage supply terminals, is that small voltage variations in the supply voltage level can lead to large variations in the bias current $I_{BIAS}$ that flows through the two transistors. Referring to the circuit of FIG. 1 and to the equation (1) above, the drain (bias) current flowing through each transistor MN1 and MN2 is proportional to the square of ($V_{GS}-V_{TH}$). For example, if $V_{DD}$ is 1.2 V, and the $V_{TH}$ of both transistors MP1 and MN1 is 0.3 V, then an increase of $V_{DD}$ to 1.3V (a factor of 1.083) causes the $V_{GS}$ voltage of both MP1 and MN1 to rise by 0.05V, which causes the DC bias current to increase with a factor:

$$\frac{Ibias(1.3\ V)}{Ibias(1.2\ V)} = \frac{(0.65-0.3)^2}{(0.6-0.3)^2} = \frac{0.1225}{0.9} = 1.36 \quad (2)$$

Hence, an increase in the supply voltage by a factor of 1.083 results in an increase in the bias current by the much larger factor of 1.36. Therefore, even small variations in the supply voltage level can make overall power consumption difficult to predict, and furthermore can result in variations in the input and output impedances, the gain, and the noise characteristics of the amplifier.

These variations complicate the design of circuits based around two series connected transistors, and make consistent operation of the circuits difficult to achieve.

It is therefore an object of the invention to improve on the known art.

According to a first aspect of the invention, there is provided a circuit comprising two transistors connected in series between positive and negative voltage supply terminals, the circuit further comprising a control circuit adapted to:

measure a current or voltage parameter of the circuit that is indicative of a bias current conducted through the two transistors; and alter the bulk voltage of at least one of the transistors in response to the measured parameter so as to maintain the bias current at a target level.

Hence, there is provided a circuit that can modify the bulk voltage of at least one of its transistors so as to maintain a steady level of bias current. The modification of the at least one transistors bulk voltage is used to control the at least one transistors threshold voltage, and the at least one transistors threshold voltage has a direct effect on the level of the bias current. This is because a reduction in the threshold voltage results in an increase in the bias current when all other factors are unchanged.

The bulk voltage that is required to maintain the bias current at a target level can be determined by measuring a current or voltage parameter of the circuit that is indicative of the present level of the bias current. For example, if the present level is measured as being slightly above or below the target level, then the bulk voltage can altered to bring the present level closer to the target level.

The maintenance of a steady level of bias current makes the power consumption of the circuit simpler to predict, and improves the consistency of the input and output impedances, the gain, and the noise characteristics of the circuit. Furthermore, maintaining a steady level of bias current helps prevent variations in the power supply voltage from entering the signal path, thereby improving the Power Supply Rejection.

Advantageously, the two transistors may be an NMOS transistor and a PMOS transistor. Using a suitable IC manufacturing process, these transistors can be placed in an isolating well, and the bulk voltages of the transistors can be easily controlled. Furthermore, the two transistors can together form a push-pull class AB amplifier suitable for use in analogue amplifier applications, as will be apparent to those skilled in the art. These amplifier circuits may be cascaded together to form a multiple-stage amplifier to achieve higher levels of gain compared to a single-stage amplifier.

The measured parameter that is indicative of the level of the bias current is a parameter whose value changes along with changes in the level of the bias current. This is irrespective of whether the parameter causes the change in the bias current, whether the bias current causes the change in the parameter, or whether another factor acts to cause changes in both the bias current and the parameter together.

Advantageously, the measured parameter may be the supply voltage level, the supply voltage level being the voltage difference between the positive supply voltage level and the negative supply voltage level. The supply voltage level is indicative of the bias current level, because an increased supply voltage level results in an increased bias current level when all other factors are unchanged. Hence, if the measured level of the supply voltage increases, then the threshold voltage of the at least one transistor may be increased by altering the bulk voltage of the at least one transistor, thereby counteracting the effect of the increased supply voltage on the level of the bias current.

If the measured level of the supply voltage decreases, then the threshold voltage of the at least one transistor may be decreased by altering the bulk voltage of the at least one transistor, thereby counteracting the effects of the decreased supply voltage on the level of the bias current.

Advantageously, the control circuit may comprise at least one replica transistor for determining the bulk voltage level that should be applied to the at least one transistor of the two transistors. Each replica transistor may be connected to a respective constant current source in series between the positive and negative voltage supply terminals, and the bulk voltage level of the replica transistor may be altered so as to maintain a steady voltage at the connection between the replica transistor and the respective constant current source.

The bulk voltage levels of the at least one replica transistors are then used to alter the bulk voltage levels of at least one of the two transistors. The term replica is used to denote that a replica transistor effectively replicates a one of the two transistors, so that the correct bulk voltages for a given supply voltage level can be accurately determined.

Alternatively, the parameter that is measured may be the level of the bias current itself. If the measured level of the bias current flowing through the two transistors is above a target level, then the threshold voltages of the at least one transistor of the two transistors may be increased by altering the bulk voltages of the at least one transistors, thereby decreasing the level of the bias current to the target level.

If the measured level of the bias current is below a target level, then the threshold voltages of the at least one transistors may be decreased by altering the bulk voltages of the at least one transistors, thereby increasing the level of the bias current up to the target level.

According to a second aspect of the invention, there is provided a method for maintaining a bias current of a circuit at a target level, the circuit comprising two transistors connected in series between positive and negative voltage supply terminals, the circuit further comprising a control circuit and the method comprising:

measuring, using the control circuit, a current or voltage parameter of the circuit that is indicative of a bias current conducted through the two transistors; and altering, using the control circuit, the bulk voltage of at least one of the transistors in response to the measured parameter, so as to maintain the bias current at a target level.

These and other aspects of the invention will be apparent from and elucidated with reference to the embodiments described hereinafter.

Same or similar reference signs denote same or similar features.

Figure 2:
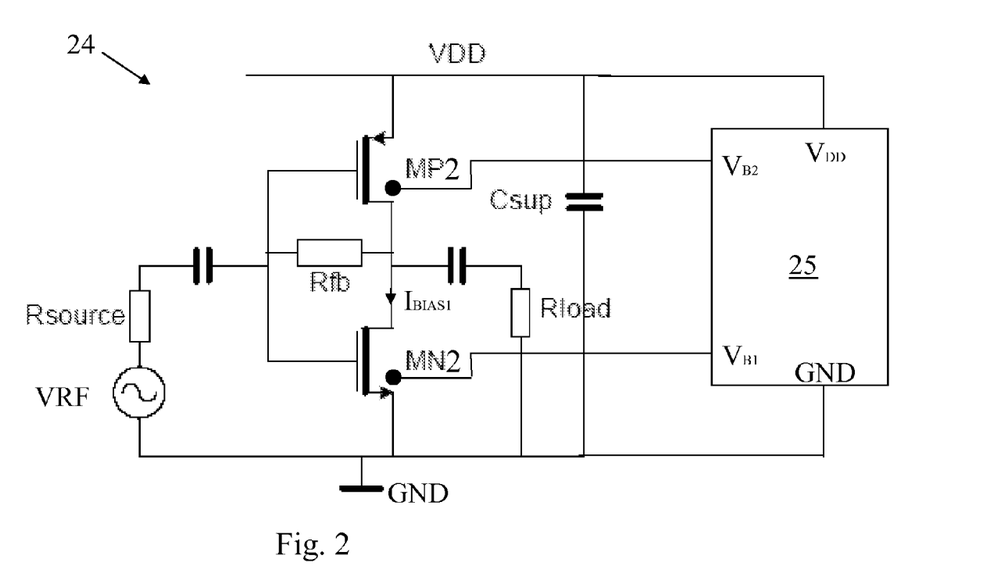
FIG. 2 shows a circuit diagram of a CMOS amplifier circuit according to an embodiment of the invention.

The CMOS amplifier circuit 24 that is shown in FIG. 2 comprises an NMOS transistor MN2 and a PMOS transistor MP2. The drain terminals of the two transistors MN2 and MP2 are connected together in series and form the output of the circuit. The gate terminals of the two transistors MN2 and MP2 are connected together and form the input Vin to the circuit. The source terminal of the NMOS transistor MN2 is connected to the negative power supply terminal GND, and the source terminal of the PMOS transistor MP2 is connected to the positive power supply terminal $V_{DD}$. A control circuit 25 applies voltage signals $V_{B1}$ and $V_{B2}$ to the bulk terminals of the transistors MN2 and MP2 respectively.

A bias current $I_{BIAS1}$ flows from the positive $V_{DD}$ to the negative GND power supply terminal through the two series connected transistors. The bias current $I_{BIAS1}$ biases the DC operating point of the amplifier. The DC operating point is the voltage point that the connection between the two transistors will return to at equilibrium (i.e. when no input signals are applied to the amplifier), as will be understood by those skilled in the art.

In use, the control circuit 25 effectively measures the supply voltage level $V_{DD}$, and then sets the transistor bulk voltages $V_{B1}$ and $V_{B2}$ according to the supply voltage measurement. The supply voltage level $V_{DD}$ is indicative of the bias current $I_{BIAS1}$ flowing through the transistors MN2 and MP2, because an increase in the level of $V_{DD}$ causes an increase in the level of the bias current when all other factors are unchanged.

A change in the bulk voltage level of a transistor results in a change in the threshold voltage level of the transistor, due to the Body Effect (or 'back gate effect'), as is known to those skilled in the art. For example, for an enhancement mode NMOS MOSFET, the threshold voltage may be calculated according to the following equation:

$$V_{TH}=V_{TO}+\chi(\sqrt{2\phi_F-V_{BS}}-\sqrt{2\phi_F})$$

wherein $V_{TO}$ is the zero bias threshold voltage, $\chi$ is the body effect parameter, $V_{BS}$ is the bulk-source voltage, and $2\phi_F$ is the absolute value of the surface voltage.

Hence, for the enhancement mode NMOS MOSFET, an increase in the bulk-source voltage results in a decrease in the threshold voltage. For a PMOS MOSFET, an increase in the bulk-source voltage results in an increase in the threshold voltage.

Therefore, when the control circuit 25 detects an increase in the level of the voltage supply $V_{DD}$ (which is expected to result in an increase in the bias current $I_{BIAS1}$), the control circuit decreases the bulk voltage $V_{B1}$ and increases the bulk voltage $V_{B2}$, thereby increasing the threshold voltages of both the transistors MN and MP, and keeping the bias current $I_{BIAS1}$ down at a target level.

Although the FIG. 2 embodiment describes the case where the bulk voltages of both of the two transistors are controlled, those skilled in the art will appreciate that in other embodiments the control circuit 25 may only control the bulk voltage of one of the two transistors, for example MN2. Then, the bulk voltage of the transistor MN2 may be altered to change the threshold voltage of transistor MN2 by an amount sufficient to maintain the bias current at a target level. The threshold voltage of transistor MN2 will clearly have to be altered further than if the threshold voltages of both transistors MN2 and MP2 were altered together.

It should be noted that the voltage source VRF, the resistors Rsource, Rfb, and Rload, and all of the capacitors are specific to this particular CMOS amplifier embodiment, and as such are not essential to the invention as defined in the appended claims. Many other circuit configurations comprising the two series connected transistors and the control circuitry 25 can benefit from the invention, and could easily be conceived by those skilled in the art.

Figure 3:
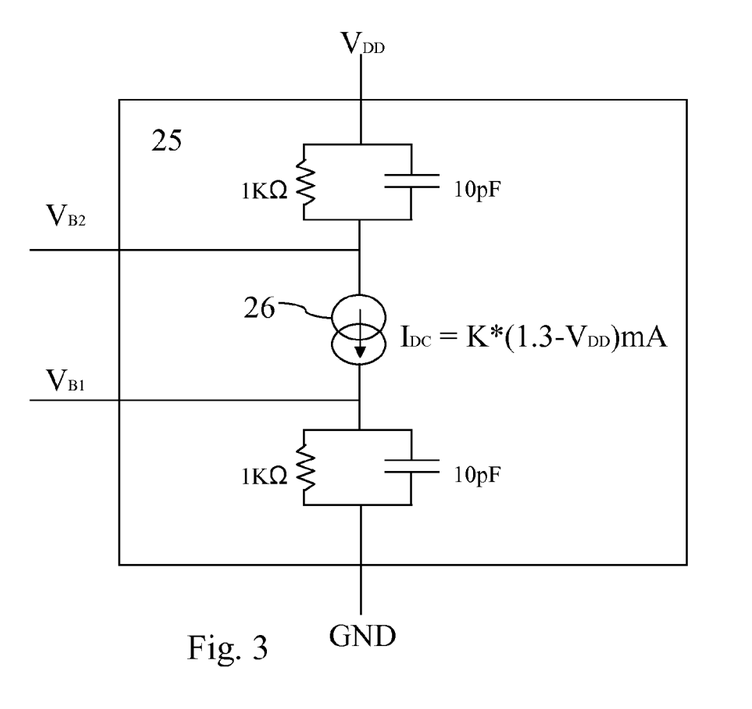
FIG. 3 shows a circuit diagram of a control circuit for use in the FIG. 2 embodiment.

FIG. 3 shows a circuit diagram of one possible implementation of the control circuit 25 of FIG. 2. The control circuit comprises a series network connected between the positive and negative power supply voltages $V_{DD}$ and GND. The series network is formed by a resistor and a capacitor connected in parallel, a current source 26 that drives a current $I_{DC}$ dependent on the power supply voltage, and a further resistor and capacitor connected in parallel.

In use, a voltage level develops across the resistors according to the level of current $I_{DC}$ that is driven by the current source 26. The voltage levels are applied to the bulk terminals of the transistors MN2 and MP2. The level of the current $I_{DC}$ is set at $K*(1.3-V_{DD})$ mA, wherein K is a constant. For the circuit of FIG. 3 when implemented as the control circuit 25 of FIG. 2, the bias current $I_{BIAS1}$ is kept approximately constant over a supply voltage range of $V_{DD}=1.1-1.3$ V when $K=0.0025$.

Hence, the control circuit effectively measures the level of the voltage parameter $V_{DD}$, and in response applies voltage levels to the bulk terminals of transistors MN2 and MP2.

The capacitors that are in parallel with the resistors reduce any RF signals that may be present at the bulk terminals of the transistors, including any noise generated by the resistors. Hence, the capacitors are optional and not essential to the circuit.

As an alternative to the FIG. 3 embodiment, in the case where the bulk voltage of only one of the two transistors (for example MN2) is to be controlled, those skilled in the art will appreciate that a circuit comprising only the current source $I_{DC}$ and a single resistor through which the current $I_{DC}$ is driven will be sufficient to develop the voltage $V_{B1}$.

Figure 4A:
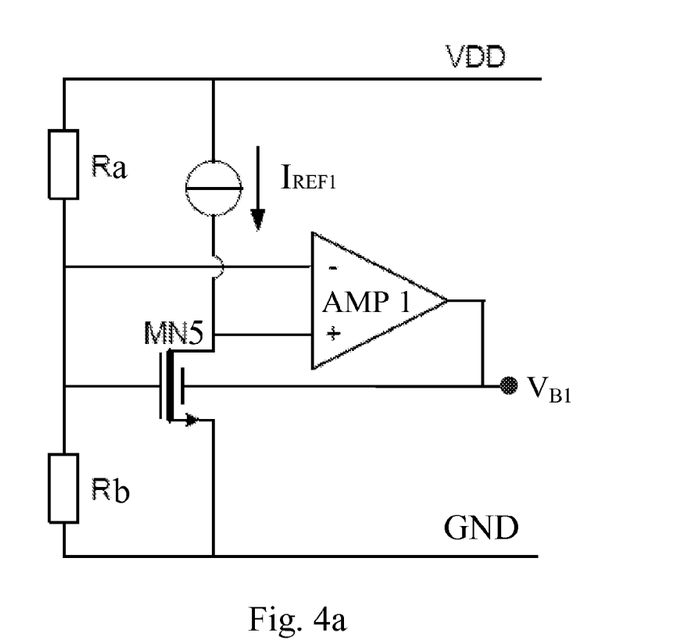
FIGS. 4a and 4b show circuit diagrams of different parts of an alternate control circuit for use in the FIG. 2 embodiment.
Figure 4B:
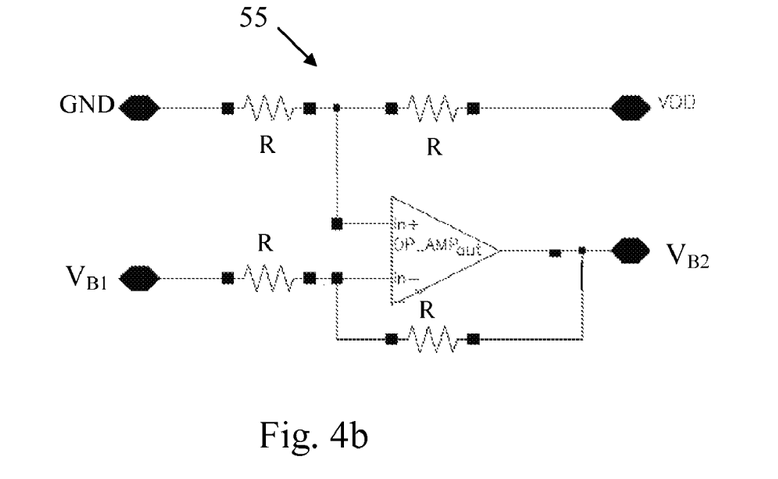

FIGS. 4a and 4b show circuit diagrams of different parts of an alternate control circuit 25 for use in the FIG. 2 embodiment. The circuit of FIG. 4a is used to generate the voltage $V_{B1}$, and the circuit of FIG. 4b is used to generate the voltage $V_{B2}$ from the voltage $V_{B1}$.

Referring to FIG. 4a, the control circuit comprises a voltage divider formed of two resistors Ra and Rb, a constant current source $I_{REF1}$, an NMOS transistor MN5, and an amplifier AMP1. The output of the voltage divider is connected to the inverting input (−) of the amplifier AMP1, and to the gate terminal of the transistor MN5. The output of the current source $I_{REF1}$ is connected to the drain terminal of the transistor MN5, and to the non-inverting input (+) of the amplifier AMP1. The output of the amplifier AMP1 is connected to the bulk terminal of the transistor MN5, and provides the output voltage signal $V_{B1}$.

In use, the voltage divider generates a reference voltage level $V_{DD}/2$, the current source drives a current $I_{REF1}$, and the amplifier AMP1 sets the bulk voltage $V_{B1}$ of the transistor MN5, thereby altering the threshold voltage of the transistor MN5 so as to make the drain terminal voltage of the transistor MN5 (and the non-inverting input of the amplifier AMP1) equal to the reference voltage level $V_{DD}/2$. The transistor MN5 serves as a replica of the transistor MN2, and so the circuit enables the bulk voltage of the transistor MN2 to be set using the bulk voltage $V_{B1}$ of the replica transistor MN5. This enables accurate control of the bias current through the two transistors MN2 and MP2, without any need to directly measure the bias current of MN2 and MP2. Hence, the design of the two transistor circuit portion is not constrained by a directly connected parameter measurement circuit.

The mirroring circuit 55 of FIG. 4b generates the voltage signal $V_{B2}$ by mirroring the voltage signal $V_{B1}$ about a voltage level that is half of the supply voltage level, such that $V_{B2}=V_{DD}-(V_{B1}-GND)$. For example, if $V_{DD}=1.2V$ and $V_{B1}=0.8V$, then $V_{B2}=0.4V$. Hence, $V_{B1}$ is mirrored about $0.6V$ ($V_{DD}/2$) to give $V_{B2}$, as will be apparent to those skilled in the art.

When the circuits of FIGS. 4a and 4b are used to form the control circuit 25 of FIG. 2, the operation of the FIG. 2 circuit is as follows. If the voltage level of the power supply $V_{DD}$ increases, then the bias current $I_{BIAS1}$ through transistors MN2 and MP2 begins to increase above the target level, and the voltage level $V_{DD}/2$ that is applied to the inverting terminal of the amplifier AMP1 is increased. Then, the amplifier AMP1 reduces the voltage $V_{B1}$, thereby increasing the threshold voltage of the transistor MN5 leading to reduction of MN5 drain current causing the voltage at the non-inverting input of the amplifier AMP1 to go up to $V_{DD}/2$. The mirroring circuit of FIG. 4b causes a corresponding increase in the voltage $V_{B2}$, since $V_{B2}=V_{DD}-(GND-V_{B1})$.

The reduction in the voltage $V_{B1}$ results in a increase in the threshold voltage of the transistor MN2, and the increase in the voltage $V_{B2}$ results in an increase in the threshold voltage of the transistor MP2, thereby reducing the level of the bias current $I_{BIAS1}$ back to the target level. Hence, the transistor MN5 is used as a 'replica' of the transistor MN2, to determine the change in the bulk voltage that is required in order to maintain a steady bias current $I_{BIAS1}$ in response to a change in the supply voltage $V_{DD}$.

One possible modification to the circuit of FIG. 4a, is to replace the resistor Ra with another constant current source. Then, the gate-source voltage of the transistor MN5 is fixed by the voltage developed across the resistor Rb, and the output of the amplifier AMP1 sets the bulk voltage $V_{B1}$ so as to maintain both the fixed gate-source voltage and the drain-source current $I_{REF1}$ of transistor MN5.

Figure 5:
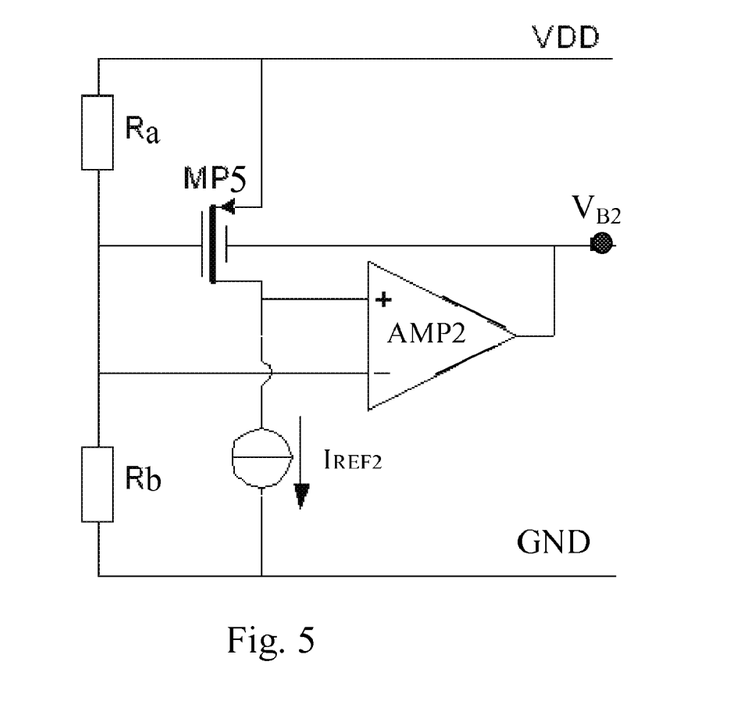
FIG. 5 shows a circuit diagram of an alternate implementation of the circuit of FIG. 4b.

FIG. 5 shows an alternate circuit to FIG. 4b for generating the bulk voltage signal $V_{B2}$ that is applied to the PMOS transistor MP2 of the amplifier of FIG. 2. The circuit of FIG. 5 works in a very similar fashion to the circuit of FIG. 4a, as will be apparent to those skilled in the art. In this embodiment, the same voltage divider formed of resistors Ra and Rb is used to generate the reference voltage for application to the inverting input (−) of both the circuits of FIG. 4a and the circuit of FIG. 5. Alternatively, the reference voltages for the circuits of FIG. 4a and FIG. 5 may be generated separately, for example using two voltage dividers or using two series networks, each comprising a series connected resistor and constant current source.

The mirroring circuit of FIG. 4b requires less circuit components than the circuit of FIG. 5, however the mirroring circuit of FIG. 4b assumes that the characteristics of the NMOS and PMOS transistors are identical, which may not always be the case. Hence, the circuit of FIG. 5 may be used in place of the circuit of FIG. 4b, in order to give more accurate control over the bulk voltage signal $V_{B2}$.

Figure 6:
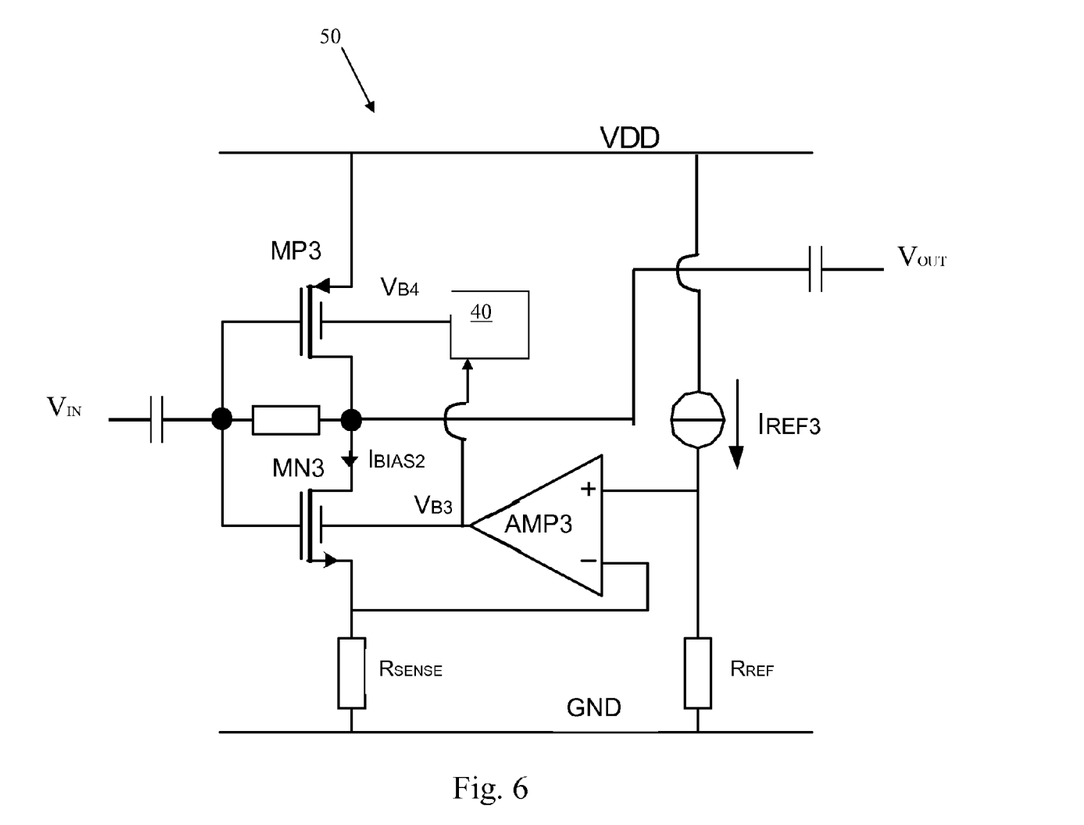
FIG. 6 shows a circuit diagram of a circuit according to a further embodiment of the invention.

A further embodiment of the invention, wherein the bias current through the two transistors is measured directly, will now be described with reference to FIG. 6. The circuit 50 shown in FIG. 6 comprises a PMOS transistor MP3 and NMOS transistor MN3 that are connected in series between positive and negative supply voltages $V_{DD}$ and GND. Furthermore, a sense resistor $R_{SENSE}$ is connected in series between the transistor MN3 and the negative supply voltage GND.

The circuit 50 further comprises an amplifier AMP3 that has one inverting input (−) connected to the sense resistor $R_{SENSE}$, and one non-inverting input (+) connected to a constant current source $I_{REF3}$ and a resistor $R_{REF}$. The output $V_{B3}$ of the amplifier AMP3 is connected to the bulk terminal of the transistor MN3, and to the input of a mirroring circuit 40. The output $V_{B4}$ of the mirroring circuit 40 is connected to the bulk voltage terminal of the transistor MP3.

The control circuit of this embodiment is clearly formed of the resistor $R_{SENSE}$, the amplifier AMP3, the mirroring circuit 40, the resistor $R_{REF}$, and the constant current source $I_{REF3}$.

In use, a bias current $I_{BIAS2}$ flows through the two transistors MN3 and MP3, and the sense resistor $R_{SENSE}$. A voltage is developed across the resistor $R_{SENSE}$ in proportion to the level of the bias current $I_{BIAS2}$, and this voltage is input to the inverting terminal of the amplifier AMP3. The non-inverting terminal of the amplifier AMP3 is connected to a voltage reference signal that is set according to the level of the constant current source and the value of the resistor $R_{REF}$, as will be apparent to those skilled in the art. The output $V_{B3}$ of the amplifier AMP3 is connected to the input of the mirroring circuit 40, which mirrors the value of $V_{B3}$ about $V_{DD}/2$, to output the signal $V_{B4}=V_{DD}-(V_{B3}-GND)$. The mirroring circuit 40 is implemented as shown in FIG. 4b, except that $V_{B1}$ is replaced by $V_{B3}$, and $V_{B2}$ is replaced by $V_{B4}$.

The output of the amplifier AMP3 acts to alter the bulk voltages $V_{B3}$ and $V_{B4}$ of the transistors MN3 and MP3, so as to alter the transistor's threshold voltages to make the bias current $I_{BIAS2}$ develop the same voltage across the resistor $R_{SENSE}$ as is developed across the resistor $R_{REF}$. Hence, the bias current $I_{BIAS2}$ is maintained at a target level.

For example, if the level of the bias current $I_{BIAS2}$ begins to increase (e.g. due to an increase in the supply voltage level $V_{DD}$), then the voltage developed across the resistor $R_{SENSE}$ will increase. Consequently, the amplifier AMP3 will decrease its output voltage $V_{B3}$, and the mirroring circuit will increase its output voltage $V_{B4}$. The decrease in $V_{B3}$ and the increase in $V_{B4}$ results in an increase in the threshold voltages of both MN3 and MP3, thereby reducing the bias current $I_{BIAS2}$ back to the target level.

In this embodiment, the value of the resistor $R_{SENSE}$ is 5 ohm, and the value of the resistor $R_{REF}$ is also 5 ohm.

Therefore, the amplifier AMP3 controls the transistor bulk voltages $V_{B3}$ and $V_{B4}$ to make the level of bias current $I_{BIAS2}$ the same as the level of current supplied by the constant current source $I_{REF3}$. Hence, the target level for the current $I_{BIAS2}$ may be set by setting the level of the constant current source $I_{REF3}$.

The values of the resistors $R_{REF}$ and $R_{SENSE}$ may be individually varied, although the value of the resistor $R_{SENSE}$ is preferable small so that the voltage developed across it does not consume an excessive portion (for example more than 10%) of the supply voltage range, and significantly reduce the output voltage range of the amplifier.

One of the advantages of this embodiment is that it provides a simple control circuit wherein the level of the bias current $I_{BIAS2}$ can be easily set by setting the value of the constant current source $I_{REF3}$.

In summary, there is provided a method and circuit for maintaining a bias current that flows through two transistors at a target level. The two transistors are both connected to form a series network between positive and negative voltage supply terminals. The bias current flows through the two transistors when the circuit is in equilibrium, and the threshold voltage of the transistors is controlled by controlling the voltage that is applied to the transistors bulk terminals. In addition to the two transistors, there is provided a control circuit that measures a circuit parameter that is indicative of the level of the bias current flowing through the two transistors. In response to the measured parameter, the control circuit adjusts the bulk voltage levels of the two transistors so as to alter the transistors threshold voltages and maintain the level of bias current at a target level.

From reading the present disclosure, other variations and modifications will be apparent to the skilled person. Such variations and modifications may involve equivalent and other features which are already known in the art of amplifier design, and which may be used instead of, or in addition to, features already described herein. In particular, there are a wide range of alternative control circuits that may be readily devised by those skilled in the art, and which perform the claimed function of measuring a circuit parameter that is indicative of a bias current flowing through two transistors, and altering the transistor bulk voltages so as to maintain the bias current at a target level.

The circuits described in the embodiments all use the ground voltage level for the negative supply voltage, however other voltage levels that are below the supply voltage level $V_{DD}$ may also be used.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A circuit comprising two transistors connected in series between a positive voltage supply terminal and negative voltage supply terminal, the circuit further comprising a control circuit adapted to:
   measure a current or voltage parameter of the circuit that has a value that varies in proportion to a bias current conducted through the two transistors; and
   alter the bulk voltage of at least one of the transistors in response to the measured parameter so as to maintain the bias current at a target level.

2. The circuit of claim 1, wherein the measured parameter is the voltage supply level, and wherein the control circuit is adapted to alter the bulk voltage of the at least one transistor to:
   increase the threshold voltage of the at least one transistor in response to an increase in the voltage supply level; and
   decrease the threshold voltage of the at least one transistor in response to a decrease in the voltage supply level.

3. The circuit of claim 2, wherein the control circuit comprises a current source that is adapted to source a level of current according to the voltage supply level, and wherein the control circuit further comprises, at least one resistor through which the level of current is drivable, in order to develop at least one voltage for application to the bulk of the at least one transistor.

4. The circuit of claim 1, wherein the measured parameter is the bias current through the two transistors, and wherein the control circuit is adapted to alter the bulk voltage of the at least one transistor to:
increase the threshold voltage of the at least one transistors in response to an increase in the bias current; and
decrease the threshold voltage of the at least one transistor in response to a decrease in the bias current.

5. The circuit of claim 1, wherein the two transistors are an NMOS transistor and a PMOS transistor.

6. The circuit of claim 1, wherein an input terminal is connected to the gate terminals of the two transistors, and wherein an output terminal is connected between the two transistors, thereby forming an amplifier circuit.

7. A circuit comprising a cascade of the amplifier circuits of claim 6.

8. The circuit of claim 1, wherein the control circuit is configured and arranged to alter the bulk voltage level of at least one of the two transistors by altering a back gate effect and changing the threshold voltage level of the transistor.

9. A circuit comprising:
two transistors connected in series between a positive voltage supply terminal and a negative voltage supply terminal, and
a control circuit adapted to:
measure a current or voltage parameter of the circuit that is indicative of a bias current conducted through the two transistors, the parameter being the voltage supply level;
alter the bulk voltage of at least one of the transistors in response to the measured parameter so as to maintain the bias current at a target level and to increase the threshold voltage of the at least one transistor in response to an increase in the voltage supply level; and
decrease the threshold voltage of the at least one transistor in response to a decrease in the voltage supply level; and
wherein the control circuit comprises a first replica transistor and a first constant current source connected in series between the positive and negative voltage supply terminals, the control circuit further comprising a first amplifier that has an input connected between the first replica transistor and the first constant current source, and that has an output connected to the bulk of the first replica transistor, wherein the first amplifier is adapted to control the bulk voltage of the first replica transistor so as to maintain the amplifier input at a first reference voltage level; and wherein the output of the first replica transistor is arranged to alter the bulk voltage of the at least one transistor of the two transistors.

10. The circuit of claim 9, wherein the first reference voltage level is supplied to a further input of the first amplifier, and wherein the reference voltage level is generated by a voltage divider connected between the positive and negative voltage supply terminals, or by a resistor and a current source connected in series between the positive and negative voltage supply terminals.

11. The circuit of claim 9, wherein the control circuit further comprises a mirroring circuit for mirroring the bulk voltage of the first replica transistor about a voltage level that is half of the supply voltage level, wherein the bulk voltage of the first replica transistor is connected to the bulk of one of the two transistors, and wherein the mirrored bulk voltage is connected to the bulk of the other of the two transistors.

12. The circuit of claim 9, wherein the output of the first replica transistor is arranged to alter the bulk voltage of one transistor of the two transistors; and wherein the control circuit further comprises:
a second replica transistor and a second constant current source connected in series between the positive and negative voltage supply terminals; and
a second amplifier that has an input connected between the second replica transistor and the second constant current source, and that has an output connected to the bulk of the second replica transistor; wherein the second amplifier is adapted to control the bulk voltage of the second replica transistor so as to maintain the amplifier input at second reference voltage level; and wherein the output of the second replica transistor is arranged to alter the bulk voltage of the other transistor of the two transistors.

13. The circuit of claim 12, wherein the first reference voltage level is supplied to a further input of the first amplifier, wherein the second reference voltage level is supplied to a further input of the second amplifier, and wherein the first and second reference voltage levels are the same voltage level and are generated by a voltage divider connected between the positive and negative voltage supply terminals, or by a resistor and a current source connected in series between the positive and negative voltage supply terminals.

14. A circuit comprising:
two transistors connected in series between a positive voltage supply terminal and a negative voltage supply terminal,
a control circuit including a sense resistor connected in series with the two transistors and adapted to conduct the bias current of the two transistors, the control circuit being adapted and configured to:
measure a current or voltage parameter of the circuit that is indicative of a bias current conducted through the two transistors; and
alter, in response to the measured parameter so as to maintain the bias current at a target level, the bulk voltage of the at least one transistor according to the voltage developed across the sense resistor.

15. The circuit of claim 14, wherein the control circuit further comprises an amplifier, wherein the inputs to the amplifier are connected to the sense resistor and to a voltage reference, and wherein the output of the amplifier is connected to the bulk of the at least one transistor.

16. A method for maintaining a bias current of a circuit at a target level, the circuit comprising two transistors connected in series between positive and negative voltage supply terminals, the circuit further comprising a control circuit and the method comprising:
measuring, using the control circuit, a current or voltage parameter of the circuit that has a value that varies in proportion to a bias current conducted through the two transistors; and
altering, using the control circuit, the bulk voltage of at least one of the transistors in response to the measured parameter, so as to maintain the bias current at a target level.

17. A circuit comprising:
two transistors connected in series between a positive voltage supply terminal and a negative voltage supply terminal; and
a control circuit adapted to:
measure a voltage parameter of the circuit indicative of a bias current conducted through the two transistors;

compare the voltage parameter to a reference voltage using a difference amplifier; and alter the bulk voltage of at least one of the transistors using an output of the difference amplifier so as to maintain the bias current at a target level.

18. The circuit of claim 17, wherein the control circuit is configured and arranged to alter the bulk voltage level of at least one of the two transistors by altering a back gate effect and changing the threshold voltage level of the transistor.

19. The circuit of claim 17, wherein the control circuit includes a current source that is configured and arranged to sense a level of current according to a voltage supply level, and wherein the control circuit further includes at least one resistor having a drivable level of current, that is configured and arranged to develop at least one voltage for application to the bulk voltage of the at least one of the two transistors.

* * * * *